(12) United States Patent
Ahn et al.

(10) Patent No.: US 8,242,590 B2
(45) Date of Patent: *Aug. 14, 2012

(54) SILICON WAFER FOR SEMICONDUCTOR WITH POWERSUPPLY SYSTEM ON THE BACKSIDE OF WAFER

(75) Inventors: Hyo-Jun Ahn, Jinju-si (KR); Ki-Won Kim, Jinju-si (KR); Jou-Hyeon Ahn, Jinju-si (KR); Tae-Hyun Nam, Jinju-si (KR); Kwon-Koo Cho, Jinju-si (KR); Hwi-Beom Shin, Jinju-si (KR); Hyun-Chil Choi, Busan (KR); Gyu-Bong Cho, Jinju-si (KR); Tae-Bum Kim, Busan (KR); Ho-Suk Ryu, Jinju-si (KR); Won-Cheol Shin, Jinju-si (KR); Jong-Seon Kim, Masan-si (KR)

(73) Assignee: Industry-Academic Cooperation Foundation Gyeongsang National University, Jinju-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/020,684

(22) Filed: Feb. 3, 2011

(65) Prior Publication Data

US 2011/0193238 A1 Aug. 11, 2011

Related U.S. Application Data

(63) Continuation of application No. 12/089,880, filed as application No. PCT/KR2006/004154 on Oct. 13, 2006, now Pat. No. 7,915,725.

(30) Foreign Application Priority Data

Dec. 5, 2005 (KR) ........................ 10-2005-0117648

(51) Int. Cl.
*H01L 23/52* (2006.01)
(52) U.S. Cl. .............................. 257/691; 257/E23.153
(58) Field of Classification Search ................... 257/691
See application file for complete search history.

(56) References Cited

U.S. PATENT DOCUMENTS

| 4,855,613 A | 8/1989 | Yamada et al. |
| 5,874,782 A | 2/1999 | Palagonia |

FOREIGN PATENT DOCUMENTS

| EP | 1 134 808 | 9/2001 |
| KR | 10-1998-0039680 | 8/1998 |

*Primary Examiner* — David Zarneke

(57) ABSTRACT

A battery mounted semiconductor device is provided. A battery mounted semiconductor device comprises a semiconductor silicon wafer, an electric power supply formed on a backside of the semiconductor silicon wafer and a circuit pattern formed on a front side of the semiconductor silicon wafer.

4 Claims, 3 Drawing Sheets

SILICON WAFER FOR SEMICONDUCTOR WITH POWERSUPPLY SYSTEM ON THE BACKSIDE OF WAFER

CROSS-REFERENCE TO RELATED APPLICATIONS

This application is continuation of U.S. application Ser. No. 12/089,880, filed Apr. 10, 2008, now U.S. Pat. No. 7,915,725 which claims the benefit of PCT Application No. 10-PCT/KR2006/004154, filed Oct. 13, 2006, which claims the benefit of Korean Patent Application 10-2005-0117648, filed Dec. 5, 2005. The contents of each of these applications are incorporated herein by reference.

BACKGROUND OF THE INVENTION

1. Field of the Invention

The present invention relates to a battery mounted semiconductor device with a built-in electric power supply on the backside.

2. Description of the Related Art

A semiconductor chip currently used is operated by an external battery or AC power source. Even though there is a unit, in the semiconductor chip, which operates from an external power source, all necessary power for the semiconductor chip is entirely dependent on an external power source, and there is no self-supplied power source in the chip. If a self-supplied power source is available, it is usually used as a standard power source for both memory and non-memory semiconductor chips, a backup power source, and a standby power source. In particular, an active RFID, SOC (system on a chip)), LOC (lab. on a chip), solar battery, and so on make best use of the self-supplied power source. For now, only the concept of a thin film battery and its possible application as a power source for a semiconductor chip has been established, and there has not been any report on an internal power source of the semiconductor chip. Therefore, a need exists to develop a concept and system for embedding an electric power supply into a semiconductor chip, and especially to establish its fabrication process simple and easy to operate.

In case of a conventional semiconductor device, transistors, resistors, and capacitors are all built on the front side of a silicon wafer, leaving no specific function for its back side except for the use as a supporter.

An existing fabrication method of a thin-film battery involves patterning a battery area while the semiconductor process is under way, followed by deposition and etching. Unfortunately, the method is exposed to an increase of fabrication cost related to photo lithography and to a change in properties of semiconductor wafers due to heat budget from a battery material subjected to high-temperature heat treatment.

In view of the foregoing problems, it is, therefore, an object of the present invention to provide a semiconductor wafer, especially a semiconductor silicon wafer, having an electric power supply affixed to its non-occupied (or non-utilized) backside as a self-supplied power source for a semiconductor chip in a battery, so that power can be supplied within a semiconductor device.

In other words, the invention is directed to provide a battery mounted semiconductor device having a built-in electric power supply on the backside thereof.

SUMMARY OF THE INVENTION

Accordingly, the purpose of the present disclosure is to provide a battery mounted semiconductor device comprising a semiconductor silicon wafer, an electric power supply formed on a backside of the semiconductor silicon wafer and a circuit pattern formed on a front side of the semiconductor silicon wafer.

According to an exemplary embodiment of the present disclosure, a battery mounted device comprises a silicon wafer, an electric power supply formed on a back side of the silicon wafer and a circuit pattern formed on a front side of the silicon wafer.

According to an exemplary embodiment of the present disclosure, a battery mounted device comprises a silicon wafer, an electric power supply formed on a backside of the silicon wafer, a circuit block provided to a front side of the silicon wafer and a plurality of internal plugs connected from the electric power supply to the circuit block.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF EXEMPLARY EMBODIMENTS OF THE INVENTION

Figure 1:
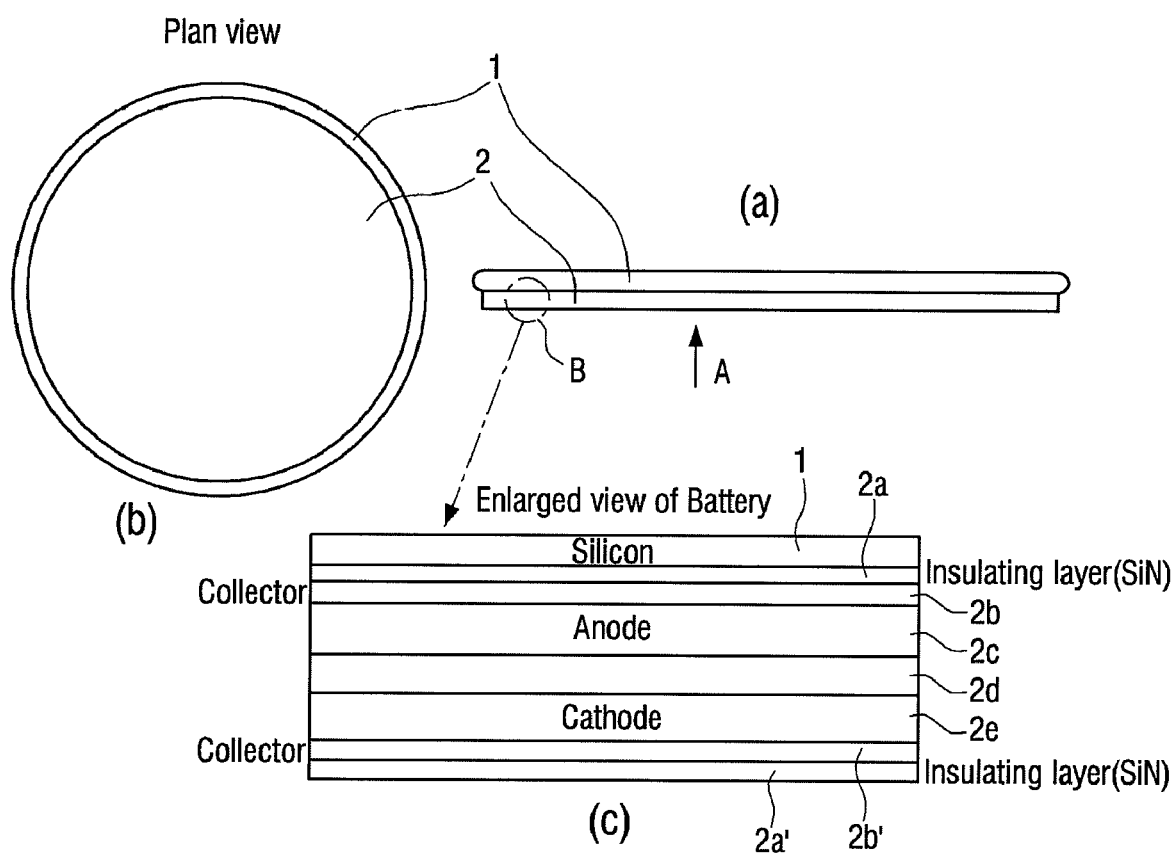
FIG. 1(a) illustrates a cross-sectional view of a silicon wafer designed to have an electric power supply on its backside by a thin-film process.
FIG. 1(b) is a plan view of the silicon wafer of FIG. 1(a) seen from the direction indicated by arrow "A".
FIG. 1(c) is an enlarged view of "B" portion of FIG. 1(a).

Certain exemplary embodiments of the present invention will now be described in greater detail with reference to the accompanying drawings.

In the following description, like drawing reference numerals are used for like elements, even in different drawings. The matters defined in the description, such as detailed construction and elements, are provided to assist in a comprehensive understanding of the invention. However, the present invention can be practiced without those specifically defined matters. Also, well-known functions or constructions are not described in detail since they would obscure the invention with unnecessary detail.

Hereinafter, preferred embodiments of the present invention will be set forth in detail with reference to the accompanying drawings.

FIG. 1(a) illustrates a cross-sectional view of a silicon wafer designed to have an electric power supply on its backside by a thin-film process; FIG. 1(b) is a plan view of the silicon wafer of FIG. 1(a) seen from the direction indicated by arrow A; and FIG. 1(c) is an enlarged view of "B" portion of FIG. 1(a).

As for the electric power supply 2, any commercial energy conversion and storage device that is capable of converting or storing electricity may be used. Examples of such a device include a secondary cell, a micro fuel cell, a capacitor and the like. This electric power supply may be installed on the backside of a wafer, singly or in combination of two or more. For instance, a secondary cell, a capacitor, and a micro fuel cell may be affixed onto the wafer backside singly or in combination of the secondary cell and the capacitor (or in combination of the micro fuel cell and the secondary cell) at the same time.

As is seen in FIG. 1(c), the electric power supply 2 may have a 3-layered structure consisting of three thin films of a cathode 2e, an anode 2c, and an electrolyte 2d, or a 3-dimensional micro structure consisting of bar-shaped electrodes and a solid electrolyte. At this time, the semiconductor device on the front side of the wafer should be electrically insulatable from the electric power supply 2, and ions involved in the electrochemical reaction in a battery must not move around. For this reason, insulating layers 2a and 2a' are deposited between the electric power supply and the front side of the semiconductor wafer. Any insulating, dense, crystalline substance may be utilized as the material of the insulating layers. Preferred examples of such substance include SiO, SiO2, SiN, SiON and the like. Moreover, a collector is sandwiched between the insulating layer 2a and the anode 2c, and between the other insulating layer 2a' and the cathode 2e, respectively.

Figure 2:
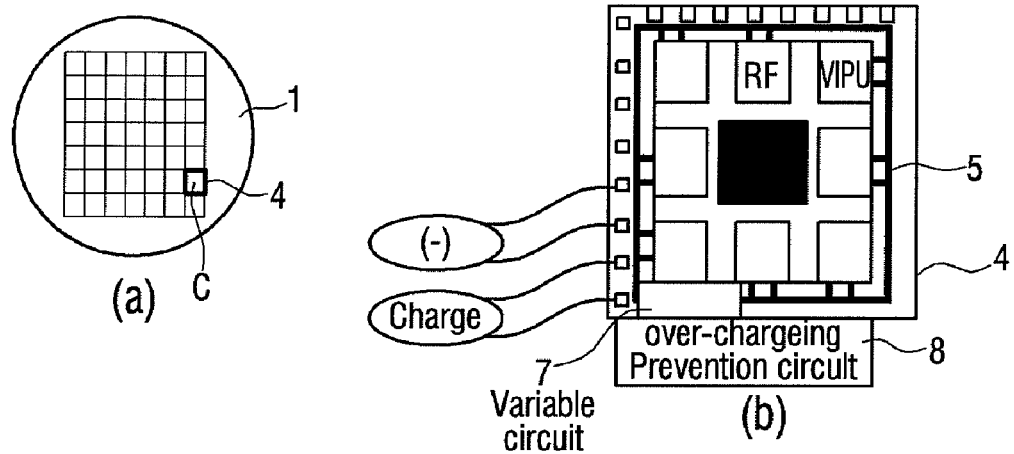
FIG. 2(a) is a plan view of a semiconductor chip diced from the wafer of FIG. 1.
FIG. 2(b) is an enlarged view of "C" portion of FIG. 2(a).
FIG. 2(c) is an enlarged view of "D" portion of FIG. 2(b).
Figure 2:
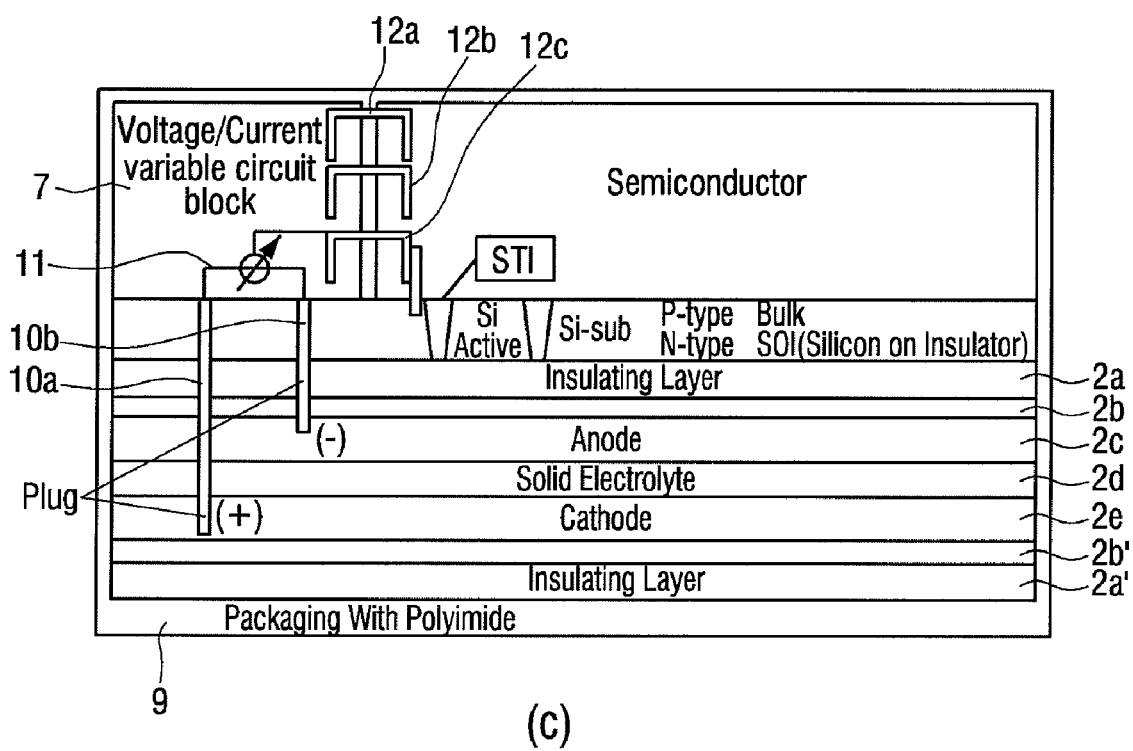

FIG. 2(a) is a plan view of a semiconductor chip 4 diced from the wafer 1 of FIG. 1; FIG. 2(b) is an enlarged view of "C" portion of FIG. 2(a); and FIG. 2(c) is an enlarged view of "D" portion of FIG. 2(b).

The electric power supply 2 is coated with a protective coating to block the intrusion of moisture and air. To meet this purpose, SiO, SiO2, SiN, SiON, polymer, oxide and the like are used as a substance of the protective coating. Once the semiconductor chip 4 is fabricated, it is packaged with a protective layer 9 made of polyimide and the like. The electric power supply may be implemented as a variable circuit block or a predetermined patterned circuit.

Plugs 10a and 10b are used as passages of electricity from the electric power supply 2 to the semiconductor chip 4. The plugs 10a and 10b are formed by etching contact holes from the front side of the semiconductor wafer 1, followed by filling up the holes with conductive substances, for example, pure metals, alloys, conductive polymers and so on. Any metal, especially Cu, Ni, W, Ti, Ta, Pt, Ru, Au, etc., capable of forming a metallic bond may be utilized.

A voltage/current variable circuit block 7 is provided to the front side of the semiconductor wafer as a passage of electricity form the electric power supply 2 into the semiconductor chip 4. The voltage/current variable circuit block 7 includes a power conversion device 11 and variable power circuits 12a, 12b, and 12c.

In detail, the power conversion device 11 connecting the cathode 2e and the anode 2c of the electric power supply 2 is installed in the voltage/current variable circuit block 7. Moreover, the (+) plug 10a is connected to the cathode of the electric power supply 11, while the (−) plug 10b is connected to the anode of the electric power supply 11. Then, the power conversion device 11 is connected to the variable power circuits 12a, 12b, and 12c. The variable power circuit consists of a variable circuit which serves to vary (or change) the voltage and current of an energy conversion device to a desired voltage and current; and an ESD (Electro Static Discharge) protection circuit which serves to protect a semiconductor device.

The following describes how to fabricate the electric power supply 2 onto the backside of the silicon wafer 1. At first, electrodes, insulating layers 2a and 2a', collectors 2b and 2b' and so on are prepared by vacuum deposition or electrochemical plating. The vacuum deposition involves sputtering, chemical vapor deposition, evaporation, or other possible methods based on the use of plasma, laser and the like.

At first, the insulating layers 2a and 2a' are deposited on the backside of the silicon wafer 1. At this time, the insulating layers 2a and 2a' are made of electrically insulating substances, e.g., SiN, SiO2 and the like, and ions thereof must not move either. Next, the cathode collector 2b is deposited on the insulating layers 2a and 2a'. The collector is preferably made of electrically conductive materials such as aluminum, copper, gold, silver, etc. Then, the anode 2c is deposited on the cathode collector 2b. A typically used battery substance is fabricated in film form to function as the anode 2c. For example, a metal hydride electrode in a nickel-hydrogen battery, and a carbon electrode or lithium compound (lithium metal, lithium alloy and so on) in a lithium battery correspond to the anode 2c. Following the deposition of the anode 2c, the solid electrolyte 2d is deposited. The solid electrolyte 2d refers to an electrolyte in solid state, and is generally made of an inorganic based substance, e.g., LiPON, lithium oxide, nitride and the like, or made of a polymer electrolyte, e.g., PEO, PMMA and the like. The inorganic based electrolyte is deposited by conventional thin film deposition methods involving evaporation or electrochemical plating; while the polymer electrolyte is deposited by spin-coating. Next, the cathode 2e made of conventional anode materials including lithium oxide (LiCoO2, LiMnO2, etc.), lithium sulfides (Li2S, LiFeS2, etc.), sulfides (FeS2, NiS, etc.), Ni(OH)2 and the like is deposited On the electrolyte 2d.

Figure 3:
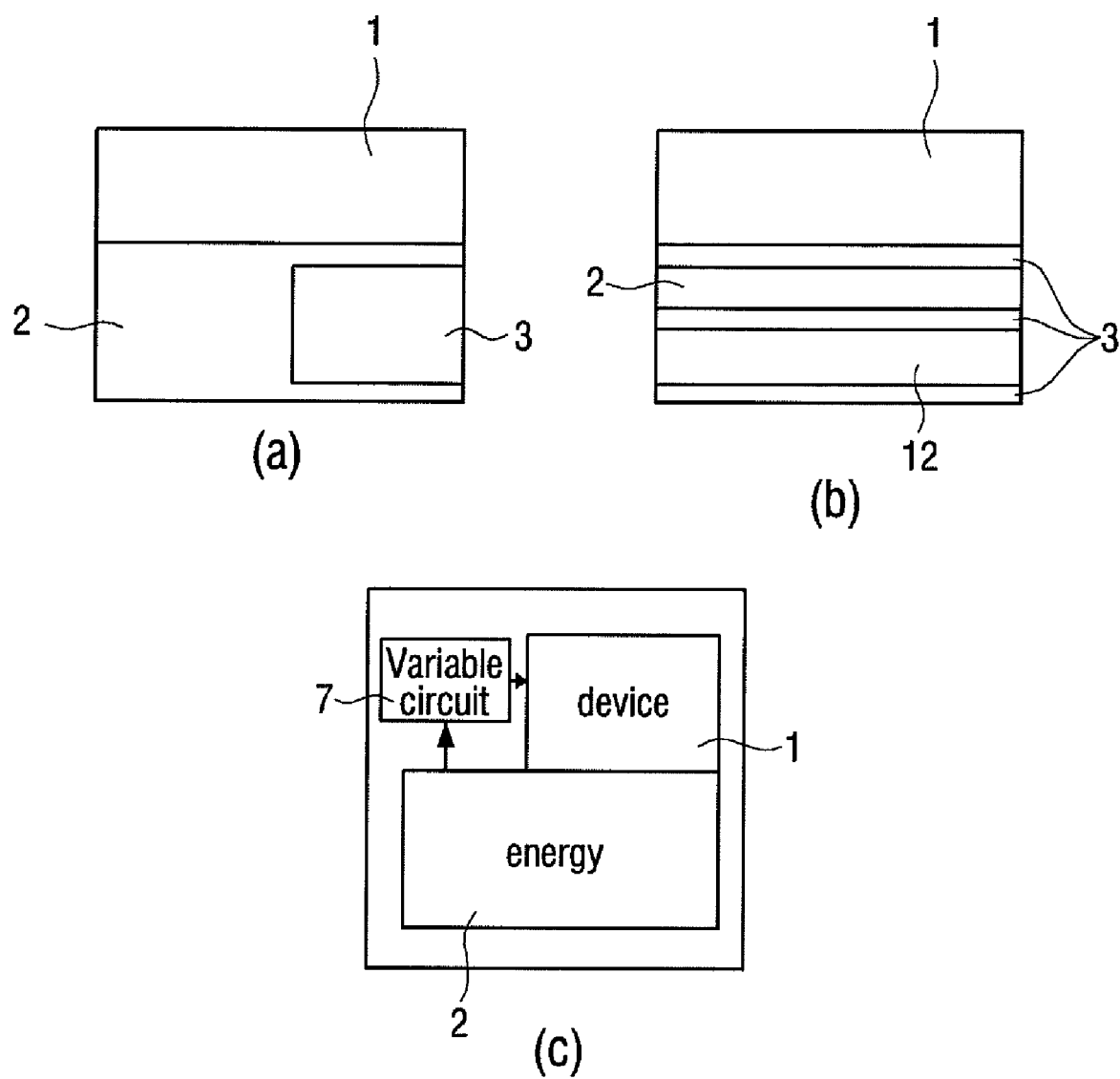
FIG. 3(a) illustrates a cross-sectional view of an example of a combined battery and capacitor used simultaneously.
FIG. 3(b) illustrates a cross-sectional view of another example of a combined battery and capacitor used simultaneously.
FIG. 3(c) shows roughly that energy moves, through a variable power circuit, from a silicon wafer having a built-in electric power supply affixed to its backside.

FIG. 3(a) illustrates a cross-sectional view of an example of the combined battery 2-1 and capacitor 2-2 used simultaneously; FIG. 3(b) illustrates a cross-sectional view of another example of a combined battery 2-1 and capacitor 2-2 used simultaneously; and FIG. 3(c) shows roughly that energy moves, through a variable power circuit, from the silicon wafer having a built-in electric power supply affixed to its backside.

In the invention, the battery 2-1 is coated with an insulating layer 3, and a capacitor 2-2 is then deposited thereon. Here, the battery 2-1 and the capacitor 2-2 are electrically connected via a plug. Alternatively, the battery 2-1 and the capacitor 2-2 may be layered sequentially (FIG. 3(b)).

If the semiconductor device requires a low power, the battery 2-1 may be used. On the other hand, if the semiconductor device requires a high power, the capacitor 2-2 may be used.

Meanwhile, a wire needs to be connected to supply power from the electric power supply 2 on the backside of the wafer 1 to the semiconductor element. This can be accomplished by etching from the front side of the wafer 1 to the backside of the wafer, and a conducting wire is connected to the cathode 2e, the anode 2c, or the collectors 2b and 2b' in plug form 10a and 10b (refer to FIG. 2(c)).

Especially, according to the present invention, the power from the backside of the wafer 1 is not supplied directly to the front side of the wafer 1, but goes via the voltage/current variable circuit block 7. Here, the variable circuit block 7 includes a circuit power conversion device 11 and a variable power circuit for varying voltage and current. When power is supplied from the variable circuit block 7 to the semiconductor device, power flows in a power line formed along the contour of a semiconductor chip 4 in 'power ring' 5 shape, contouring to the inside of the semiconductor chip 4. Moreover, the power ring is used for charging the electric power supply with externally provided electricity. This is because the variable circuit block and the (charging) PAD are bound together to the power ring. Meanwhile, although a high voltage may flow in the power ring during charge, the element does not break thanks to a special device located in the entrance of the element from the power ring.

In addition, according to the present invention, the semiconductor element and electric power supply 2 are packaged with a protective film (e.g., made of polymer like polyimide) for the protective purpose.

As explained so far, the present invention relates to a semiconductor silicon wafer having an electric power supply affixed to the backside of the wafer. By fabricating the electric power supply onto the backside of the wafer that has been left unused, the semiconductor chip can have a self-supplied power, realizing the self-powered semiconductor chip with an increased efficiency. Further, since the electric power supply is installed on the wafer, not the semiconductor chip, the fabrication procedure becomes very simple, and the battery can be mounted on any type of chip, whereby the invention can be advantageously used in electrical/electronics business.

What is claimed is:

1. A battery mounted semiconductor device comprising:
   a semiconductor silicon wafer;
   an electric power supply formed on a backside of the semiconductor silicon wafer; and
   a circuit pattern formed on a front side of the semiconductor silicon wafer.

2. A battery mounted device comprising:
   a silicon wafer;
   an electric power supply formed on a back side of the silicon wafer; and
   a circuit pattern formed on a front side of the silicon wafer.

3. A battery mounted device comprising:
   a silicon wafer;
   an electric power supply formed on a backside of the silicon wafer;
   a circuit block provided to a front side of the silicon wafer; and
   a plurality of internal plugs connected from the electric power supply to the circuit block.

4. The battery mounted device according to claim 3, wherein
   the electric power supply comprises a cathode and an anode, and
   the plurality of internal plugs comprise a negative plug which connects the cathode
   and the electric power supply, and a positive plug which connects the anode and the electric power supply.

* * * * *